United States Patent
Otremba et al.

(10) Patent No.: US 9,196,554 B2
(45) Date of Patent: Nov. 24, 2015

(54) ELECTRONIC COMPONENT, ARRANGEMENT AND METHOD

(71) Applicant: Infineon Technologies Austria AG, Villiach (AT)

(72) Inventors: Ralf Otremba, Kaufbeuren (DE); Josef Höglauer, Heimstetten (DE); Jürgen Schredl, Mering (DE); Xaver Schlögel, Sachsenkam (DE); Klaus Schiess, Allensbach (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/043,185

(22) Filed: Oct. 1, 2013

(65) Prior Publication Data

US 2015/0091176 A1 Apr. 2, 2015

(51) Int. Cl.
*H01L 23/48* (2006.01)
*H01L 23/13* (2006.01)
*H01L 23/00* (2006.01)
*H01L 25/065* (2006.01)

(52) U.S. Cl.
CPC .............. *H01L 23/13* (2013.01); *H01L 23/48* (2013.01); *H01L 24/83* (2013.01); *H01L 25/065* (2013.01); *H01L 2924/13055* (2013.01); *H01L 2924/13091* (2013.01)

(58) Field of Classification Search
USPC ......... 257/773, 668, 678, 680, 691, 692, 693, 257/698, 700, E23.001, E23.06
See application file for complete search history.

(56) References Cited

U.S. PATENT DOCUMENTS

| | | | |
|---|---|---|---|
| 4,643,935 A | 2/1987 | McNeal et al. | |
| 4,680,075 A | 7/1987 | McNeal et al. | |
| 5,491,362 A * | 2/1996 | Hamzehdoost et al. | 257/712 |
| 5,714,800 A * | 2/1998 | Thompson | 257/690 |
| 6,066,386 A | 5/2000 | Boyko et al. | |
| 6,214,525 B1 | 4/2001 | Boyko et al. | |
| 6,547,570 B2 | 4/2003 | Eskildsen et al. | |
| 6,704,204 B1 | 3/2004 | Eskildsen et al. | |
| 7,629,676 B2 | 12/2009 | Otremba et al. | |
| 7,759,777 B2 | 7/2010 | Otremba et al. | |
| 8,030,131 B2 | 10/2011 | Otremba et al. | |
| 2008/0251903 A1 | 10/2008 | Otremba et al. | |
| 2009/0236749 A1 | 9/2009 | Otremba et al. | |
| 2011/0116246 A1 | 5/2011 | Lee et al. | |

FOREIGN PATENT DOCUMENTS

DE 102007017831 A1 10/2008
DE 102009013818 A1 11/2009

* cited by examiner

*Primary Examiner* — Timor Karimy
(74) *Attorney, Agent, or Firm* — Murphy, Bilak & Homiller, PLLC (57) ABSTRACT

An electronic component includes at least one semiconductor device and a redistribution board comprising at least two nonconductive layers and a conductive redistribution structure. The semiconductor device is embedded in the redistribution board and electrically coupled to the redistribution structure and the redistribution board has a side face with a step. An outer contact pad of the redistribution structure is arranged on the step.

18 Claims, 11 Drawing Sheets

ELECTRONIC COMPONENT, ARRANGEMENT AND METHOD

BACKGROUND

A semiconductor chip may be provided in the form of an electronic component including a package with outer contacts which are used to mount the electronic component on a circuit board, such as a printed circuit board. The package may include an epoxy resin which covers the semiconductor chip, protecting it from the environment, and the internal electrical connections from the semiconductor chip to inner portions of the outer contacts. The outer contacts of the package may have various forms, such as pins, lands or solder balls.

SUMMARY

An electronic component includes at least one semiconductor device and a redistribution board comprising at least two nonconductive layers and a conductive redistribution structure. The semiconductor device is embedded in the redistribution board and electrically coupled to the redistribution structure and the redistribution board has a side face with a step. An outer contact pad of the redistribution structure is arranged on the step.

An arrangement includes a circuit board having a plurality of non-conductive layers, a redistribution structure and at least one cavity including a step comprising a contact pad electrically coupled to the redistribution structure and an electronic device comprising at least one semiconductor device embedded in a redistribution board, the redistribution board having a side face with a step and an outer contact pad arranged on the step. The electronic device is mounted in the cavity and the outer contact pad of the electronic component is mounted on the contact pad of the circuit board.

A method includes providing an electronic component comprising at least one semiconductor device embedded in a redistribution board having at least two nonconductive core layers and at least one conductive layer and removing a peripheral portion of a core layer and exposing a portion of a conductive layer on another core layer and forming an outer contact pad for the electronic device.

Those skilled in the art will recognise additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", "upper", "lower" etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

As used herein, "high-voltage" and a "high-voltage device", such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, "low-voltage" and a "low-voltage device", such as a low-voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

As used herein, conductive is electrically conductive and nonconductive is electrically nonconductive.

Figure 1:
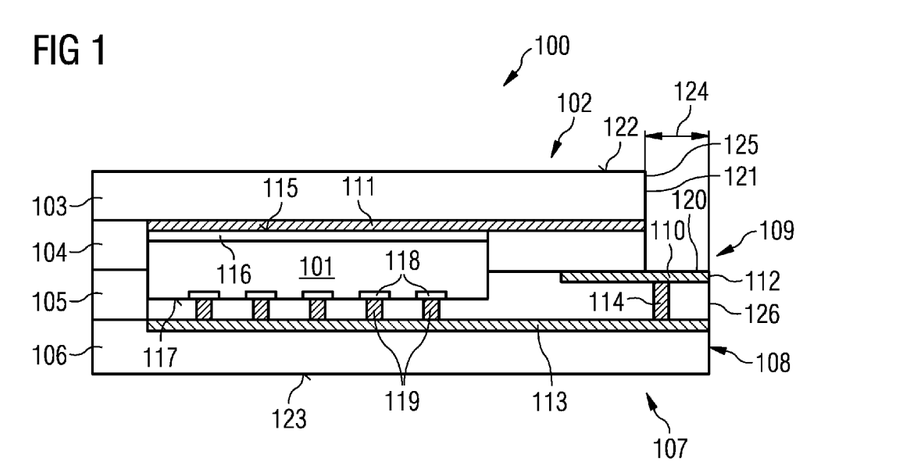
FIG. 1 illustrates an electronic component according to a first embodiment.

FIG. 1 illustrates an electronic component 100 according to a first embodiment including a semiconductor device 101 and a redistribution board 102. The redistribution board 102 includes at least two nonconductive layers. In this exemplary illustrated embodiment, the redistribution board 102 includes four nonconductive layers 103, 104, 105, 106 and a conductive redistribution structure 107. The semiconductor device 101 is embedded in the redistribution board 102 and is electrically coupled with the redistribution structure 107. The redistribution board 102 has a side face 108 with a step 109. An outer contact pad 110 of the redistribution structure 107 is arranged on the step 109.

The four nonconductive layers 103, 104, 105, 106 are arranged in a stack so that the redistribution board 102 may be considered to be a multilayer redistribution board. The nonconductive layers 103, 104, 105, 106 may include a core layer and a so-called pre-preg layer. The core layer may include a fibre-reinforced composite such as a glass fibre-reinforced epoxy resin. The pre-preg layers are used as adhesive layers in the fabrication process and include a thermosetting resin which may be cured in two stages. In the partially cured state, the thermosetting resin may be denoted as B-stage material. In this partially cured state, a first pre-preg layer may be used to adhere a metallic foil to a core layer and a second pre-preg layer may be used to apply a further core layer to the metallic foils to build up the multilayer structure of the redistribution board 102. The redistribution structure includes conductive layers, for example metallic layers, and conductive vias. The metallic layers may include copper and may be structured to include one or more conductive traces.

The step 109 is formed by a protruding region of the nonconductive layer 105 which protrudes and is exposed from the neighbouring conductive layer 104. The lateral extent of the nonconductive layers 105, 106 is greater than the lateral extent of the nonconductive layers 103, 104 to provide the step 109.

The step 109 in the side face 108 may extend over the entire width of the side face 108. The contact pad 110 may be positioned on only a portion of the protruding region providing the step 109 or may extend over the whole of the protruding region forming the step 109. In embodiments in which the outer contact pad 110 is positioned on only a portion of the step 109, further outer contact pads may be positioned on the step 109 spaced at intervals from one another. The material of the nonconductive layer 105 provides electrical insulation between the outer contact pads.

The redistribution structure 107 includes a plurality of conductive layers 111, 112, 113 with the conductive layer 111 positioned between the nonconductive layers 103, 104, the conductive layer 112 is positioned between the nonconductive layers 104, 105 and the conductive layer 113 is positioned between the nonconductive layers 105, 106. Each of the conductive layers 111, 112, 113 may be structured to provide one or more conductive traces. The redistribution structure 107 also includes a conductive via 114 extending through the thickness of nonconductive layer 105 and electrically coupling a trace of the conductive layer 113 on the lower surface of the nonconductive layer 105 to a trace of the conductive layer 112 on the upper surface of the nonconductive layer 105. The contact pad 110 is formed by an exposed area of the conductive layer 112 positioned on the upper surface of the nonconductive layer 105 forming the step 109.

The semiconductor device 101 is embedded within the redistribution board 102 and, in particular, is embedded in nonconductive layers 104, 105. The upper surface 115 of the semiconductor device 101 includes an electrode 116 which is in direct contact and electrical contact with the conductive layer 111. The opposing lower surface 117 of the semiconductor device 101 includes one or more inner contact pads 118. The lower surface 117 is positioned within the nonconductive layer 105. The redistribution board further includes at least one conductive via 119 extending between the electrode 118 and the conductive layer 113. The inner contact pads 118 are electrically connected to one or more outer contact pads 110 by the redistribution structure 107, in particular by the conductive vias 119, the conductive layer 113 and the conductive via 114.

The inner contact pads 118 and the conductive vias 119 may have a lateral area which is smaller than the area of the outer contact pad 110. The electronic component 100 can be considered to have a fan-out arrangement as the outer contact pads 110 have a larger area than the inner contact pads 118 and are distributed over a larger lateral area than the lateral area of the semiconductor device 101.

The step 109 includes a tread 120 and a rise 121. The tread 120 and the rise 121 are arranged perpendicular to one another. In this embodiment, the outer contact pad 110 is positioned only on the tread 120. The step 109 may also be considered to be a ledge protruding from the side face 108 of the redistribution board 102.

The redistribution board 102 includes an upper surface 122 which has a lateral extent which is smaller than the lateral extent of the lower surface 123. The upper surface 122 and the lower surface 123 are parallel to one another. The step 109 in the side face 108 has a width 124 corresponding to the difference in the lateral extent of the upper surface 122 and the lower surface 123. The tread 120 of the step 109 is arranged parallel to the upper surface 122 and the lower surface 123 and is perpendicular to the rise 121 extending between an upper surface 125 of the tread 120 and the upper surface 122 of the redistribution board 102. The tread 120 is also perpendicular to a rise 126 extending between the upper surface 125 of the tread 120 and the lower surface 123 of the redistribution board 102.

Figure 2:
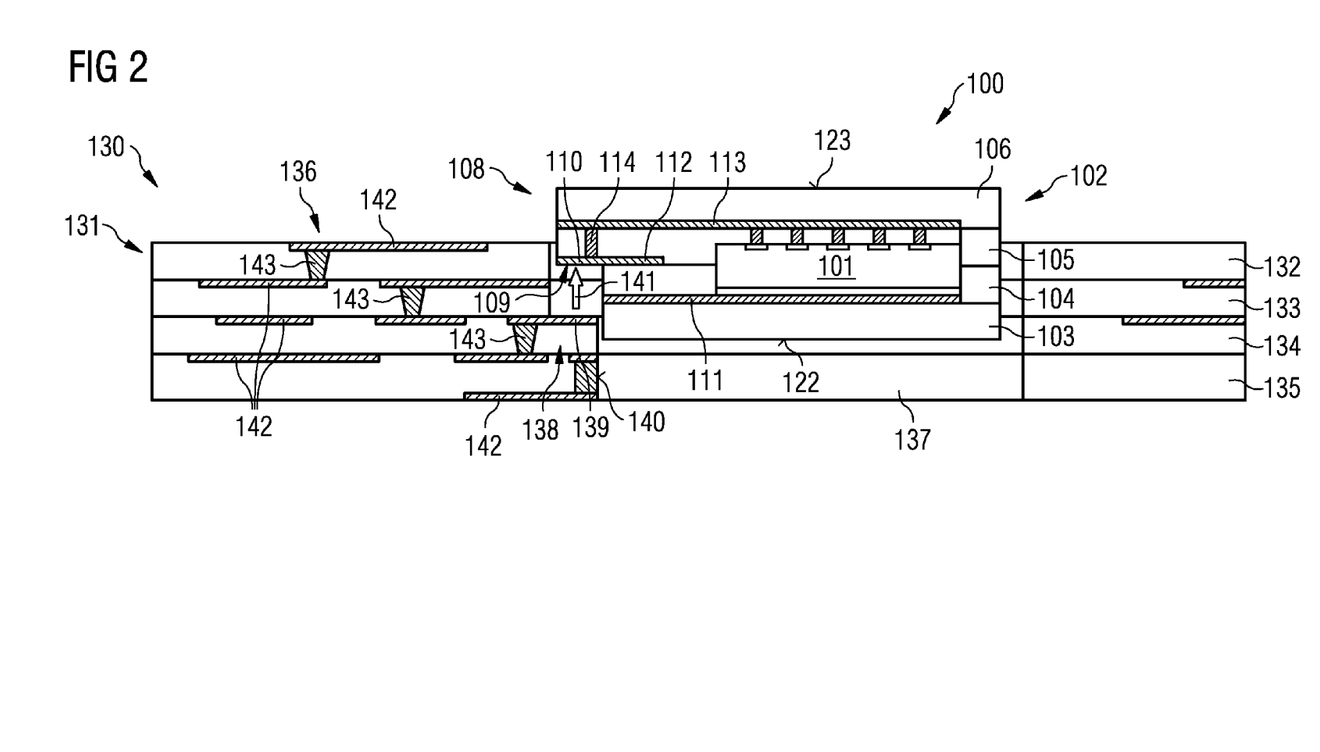
FIG. 2 illustrates an electronic component and a circuit board including a cavity.

FIG. 2 illustrates an arrangement 130 including the electronic component 100 illustrated in FIG. 1 and a circuit board 131. The circuit board 131 includes a plurality of nonconductive layers 132, 133, 134, 135, a redistribution structure 136 and a cavity 137 including a step 138. The step 138 protrudes into the lower part of the cavity 137 so that the upper portion of the cavity 137 is laterally larger than a lower region of the cavity 137 bounded by the step 138. The redistribution structure 136 of the circuit board 131 is conductive and includes an outer contact pad 139 which is arranged on the step 138 of the circuit board 131. The contact pad 139 is configured to correspond to the position of the outer contact pad 110 of the electronic component 100 when the electronic component 100 is positioned in the cavity 137.

The electronic component 100 is arranged so that its upper surface 122, which has a smaller lateral extent, faces towards the cavity 137 and its lower surface 123, which has a larger lateral extent than the upper surface 122, faces away from the cavity 137. The electronic component may be inserted into the cavity 137 in this orientation.

When the electronic component 100 is positioned in the cavity 137, the step 109 in the side face 108 of the electronic component 100 engages with and, is supported on, the step 138 in the cavity 137 of the circuit board 131. The electronic component 100 is electrically coupled to the redistribution structure 136 of the circuit board 131 by a conductive connection 141 between the outer contact pad 110 and the contact pad 139 of the circuit board 131.

In the portion of the circuit board 131 illustrated in FIG. 2, a side face 140 of the cavity 137 includes the step 138 having a form and extent matching that of the step 109 of the electronic component 100. In some embodiments, the step of the circuit board may be larger than the step of the electronic component, for example slightly wider or slightly deeper. A certain degree of play is also desirable to assist insertion of the electronic component 100 into the cavity 137.

The redistribution structure 136 of the circuit board 131 includes a plurality of electrically conductive layers 142 which are arranged on the outer surfaces of the nonconductive layers 133, 135 and at the interface between nonconductive layers 132 and 133, 133 and 134, and 134 and 135. Each of the conductive layers 142 may be structured to provide one or more conductive traces. The redistribution structure 136 further includes one or more conductive vias 143 extending between, and electrically coupling, conductive traces of differing conductive layers 142 to one another. The contact pad 139 is provided by an exposed portion of a conductive layer 142, the remainder of which is buried within the circuit board 131 and, in particular, between nonconductive layers 133, 134.

The outer contact pad 110 may be attached to the contact pad 139 by a solder connection or electrically conductive adhesive connection. The semiconductor device 101 is electrically coupled to the redistribution structure 136 of the circuit board 131 by means of the internal redistribution structure 107 of the electronic component 100, the conductive connection 141 between the electronic component 100 and the circuit board 131 and to further components not seen in the view of FIG. 2 mounted on or in the circuit board 131.

The traces of the conductive layers 142 and the conductive vias 143 of the circuit board 131 have much larger dimensions than the conductive traces of the conductive layers 111, 112, 113 and vias 114 of the electronic component 100. This enables the redistribution structure 136 of the circuit board 131 to be fabricated using simpler manufacturing methods that are suitable for large-scale production. This is useful as the circuit board 131 is generally orders of magnitude larger than the electronic component 100.

The conductive traces and conductive vias of the redistribution structure of the electronic component 100 are much finer in scale and may be more complex to manufacture. By providing the electronic component 100 with a fan-out structure so that its outer contact pad 110 has electrically area suitable for simple mounting of the electronic component 100 on the contact pad 139 of the circuit board 131, use of more complex or expensive manufacturing processes can be limited to those required only for the electronic component 100.

The multilayer structure of the redistribution board 102 of the electronic component 100 also enables the redistribution structure 107 to provide additional functions within the electronic component 100. For example, a current sensing function for a transistor device may be provided by means of a conductive trace positioned between the nonconductive layers in which the semiconductor chip, that is the transistor device, is embedded. In this embodiment, at least a portion of the redistribution structure for providing current sensing is positioned adjacent the side face of the transistor within the redistribution board 102.

Figure 3:
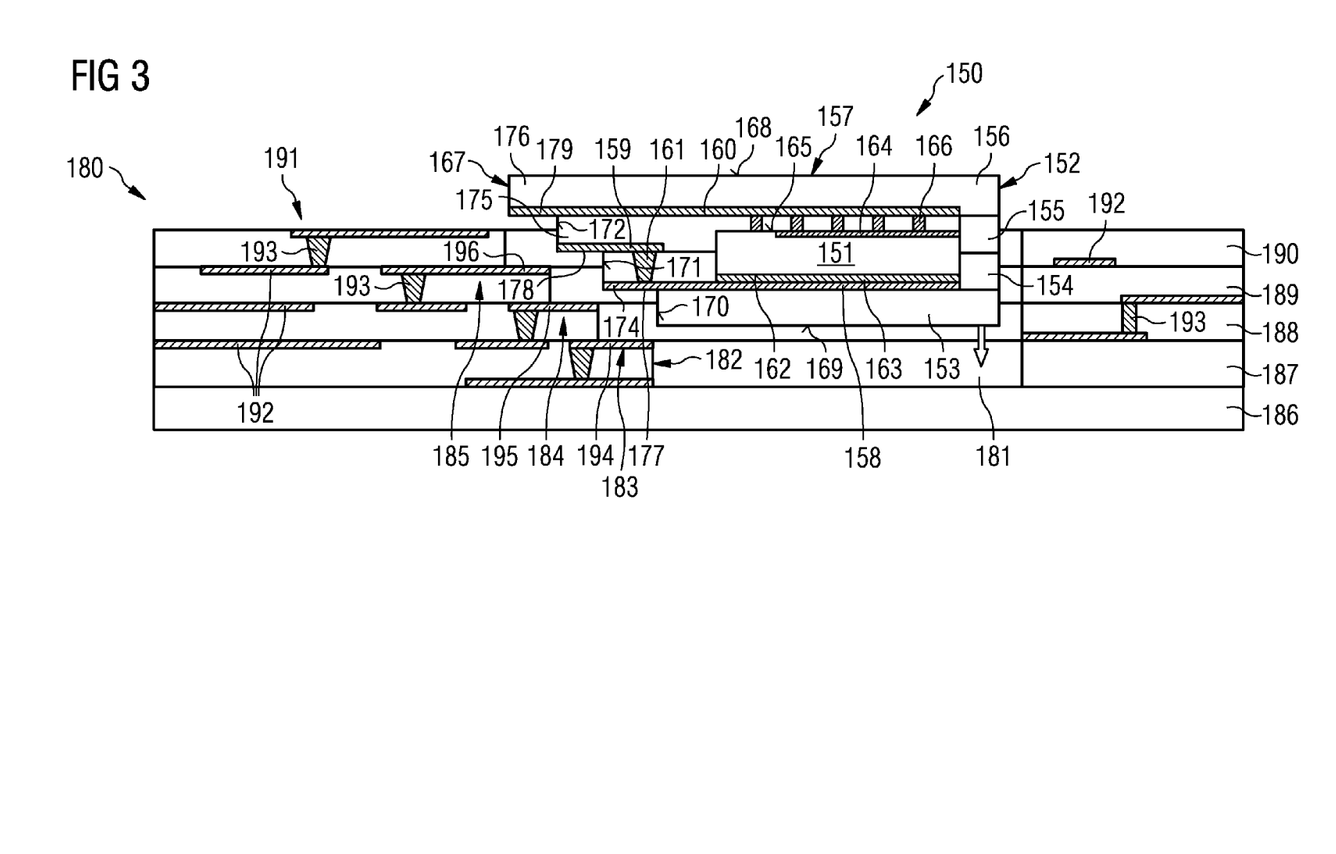
FIG. 3 illustrates an electronic component according to a second embodiment and a circuit board including a cavity.

FIG. 3 illustrates an electronic component 150 according to a second embodiment. The electronic component 150 includes a semiconductor device 151 and a redistribution board 152 with four nonconductive layers 153, 154, 155, 156 and a conductive redistribution structure 157 including three conductive layers 158, 159, 160. However, the redistribution board 152 is not limited to this arrangement and may include more or fewer conductive and/or nonconductive layers for example. The conductive layer 158 is arranged between the nonconductive layers 153, 154, the conductive layer 159 is arranged between the nonconductive layers 154, 155 and the conductive layer 160 is arranged between the nonconductive layers 155, 156, respectively. The redistribution structure 157 also includes an electrically conductive via 161 extending between a conductive trace in the conductive layer 159 and a conductive trace in the conductive layer 160.

The semiconductor device 151 is a vertical transistor device with a first current electrode 162 on a first major surface 163 and a second current electrode 164 on an opposing major surface 165. The term vertical transistor device denotes a transistor in which the drift path is vertical and orthogonal to the two major surfaces.

The semiconductor device 151 has a height which is greater than the thickness of each of the nonconductive layers 153, 154, 155, 156 of the redistribution board 152. The semiconductor device 151 is arranged embedded within the redistribution board 152 with its first major surface 163 mounted on a conductive trace of the conductive layer 158 at the interface between the nonconductive layers 153, 154. The opposing major surface 165 is positioned within the nonconductive layer 155 and is electrically coupled to a conductive trace of the conductive layer 160 positioned between nonconductive layers 155, 156 by a plurality of conductive vias 166.

The electronic component 150 has a first major plane 168 of the electronic component 150 and a second major plane 169 which are generally parallel to one another. The first major plane 168 has a larger lateral extent than the second major plane 169. The electronic component 150 differs from that of the electronic component of the first embodiment in the arrangement of the side face 167 extending between the first major surface 168 and the second major surface 169.

The side face 167 includes a plurality of steps from the second major plane 169 to the first major plane 168. The nonconductive layer 154 protrudes over side face 170 of nonconductive layer 153. The nonconductive layer 155 extends over side face 171 of nonconductive layer 154 and nonconductive layer 156 extends over side face 172 of nonconductive layer 155. The protruding regions 174, 175, 176 of the nonconductive layers 153, 154, 155, respectively, each include an outer contact pad 177, 178, 179 of the redistribution structure 157 of the electronic component 150.

The outer contact pad 177 provides a first current contact pad for the first current electrode 162 of the semiconductor device 151. The contact pad 179 provides a second current contact pad for the second current electrode 164 of the semiconductor device 151. The contact pad 178 provides current sensing for the electronic component 150. The redistribution structure 157 includes a via 161 extending between a conductive trace of the conductive layer 160 coupled to the first current electrode 162 of the semiconductor device 151 and a conductive trace 173 providing the contact pad 177. The conductive via 161 includes a material having a higher resistivity than the material of the conductive traces and, therefore, allows current sensing via the contact pad 177.

FIG. 3 also illustrates a circuit board 180 including a cavity 181 for receiving the electronic component 150. The cavity 181 has a side face 182 including three steps 183, 184, 185 configured to engage and to support the protruding regions 174, 175, 176 of the electronic component 150. The circuit board 180 includes five nonconductive layers 186, 187, 188, 189 and 190 arranged in a stack and a redistribution structure 191. However the circuit board 180 is not limited to this arrangement and may have more non-conductive and conductive layers. The cavity 181 is open at one major surface of the circuit board in order to receive the electronic component 150. The lowermost non-conductive layer 186 forms a closed base of the cavity 181 for accommodating the electronic component 150.

The circuit board 180 includes a redistribution structure 191 includes conductive traces 192 arranged on and between the nonconductive layers and conductive vias 193 which extend through the thickness of one or more of the layers to provide a three-dimensional redistribution structure 191.

The cavity 181 has a lateral extent and an inner contour which generally corresponds to the lateral extent and outer contour of the electronic component 150. The second major plane 169 with the smaller lateral area is arranged facing down towards the cavity 181 of the circuit board 180 and the first major plane 168 with the larger lateral area faces up and faces away from the circuit board 180. The cavity 181 has a depth corresponding to the height of the electronic component 150, since the cavity 181 is formed in four nonconductive layers of the circuit board 180 and the electronic component 150 is also formed from four nonconductive layers each having a thickness corresponding to the thickness of the nonconductive layers of the circuit board 180.

The protruding regions 174, 175, 176 of the electronic component 150 extend along the width of the side face 167 of the electronic component 150. Similarly, the steps 183, 184, 185 of the cavity 181 extend along the entire side of the cavity 181.

The three steps 183, 184, 185 of the circuit board 180 each include a contact pad 194, 195, 196 which is electrically coupled to the redistribution structure 191 of the circuit board 180. The electronic component 150 is mounted in the cavity 181 such that the outer contact pad 177 is mounted on, and electrically coupled to, the contact pad 194 of the nonconductive layer 187, the outer contact pad 178 of the electronic component 150 is mounted on, and electrically coupled to, contact pad 195 of the circuit board 180 and the outer contact pad 179 of the electronic component 150 is mounted on, and electrically coupled to, the contact pad 196 positioned on the nonconductive layer 189 of the circuit board 180.

The circuit board 180 may be considerably larger than the electronic component 150. For example, the electronic component 150 may include a single transistor device, such as a MOSFET, IGBT, high electron mobility transistor (HEMT) and may have a lateral area of in the order of a few millimeters. The circuit board 180 may have a lateral area in the order of square meters.

The outer contact pads 177, 178, 179 of the electronic component 150 each have a lateral area which is greater than the lateral area of the inner contact pads and, in particular, of the conductive vias 161 extending between the redistribution structure 157 of the electronic component 150 and the semiconductor device 151. For example, the inner contact areas may have dimensions in the order of tens of microns whereas the outer contact pads 177, 178, 179 may have an area in the order of square millimeters. The larger size of the outer contact pads 177, 178, 179 enables the outer contact pads 177, 178, 179 to be mounted directly on contact pads 194, 195, 196 of the steps 183, 185, 186 of the cavity 181 by solder, electrically conductive adhesive etc.

Figure 4:
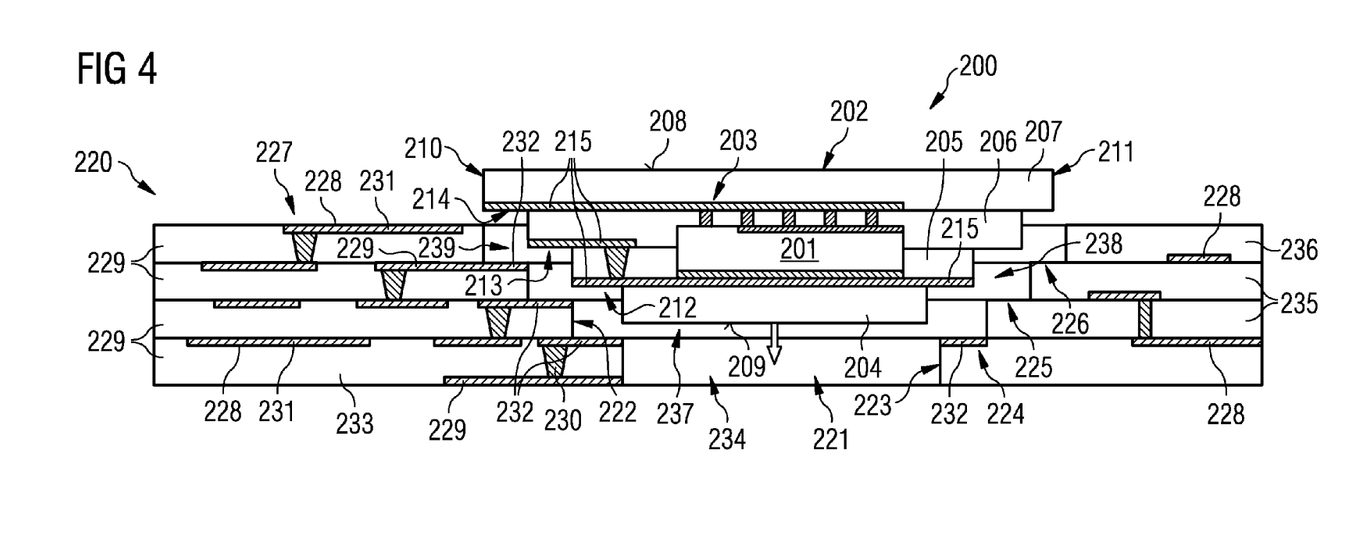
FIG. 4 illustrates an electronic component according to a third embodiment.

FIG. 4 illustrates an electronic component 200 according to a third embodiment. The electronic component 200 includes a semiconductor chip 201 and a redistribution board 202 including a conductive redistribution structure 203 with conductive traces and conductive vias. The redistribution board 202 may have two or more nonconductive layers and, in the third embodiment, includes four nonconductive layers 204, 205, 206, 207.

The electronic component 200 differs from the electronic component 150 of the second embodiment in the form of the outer contour of the redistribution board 202. At least one step is provided in two or more side faces of the redistribution board 202.

The redistribution board 202 includes an upper major surface 208 and a lower major surface 209 which are generally parallel to one another. The upper major surface 208 is laterally larger than the lower major surface 209. Two opposing side faces 210, 211 of the redistribution board 202 each include three steps 212, 213, 214 from the lower major surface 209 to the upper major surface 208.

The step 212 is formed by peripheral regions of the nonconductive layer 205 extending or protruding over the lateral extent of the adjacent nonconductive layer 204. Similarly, the step 213 on the two opposing side faces 210, 211 of the electronic component 200 is formed by peripheral regions of the nonconductive layer 206 protruding over the lateral extent of the adjacent nonconductive layer 205 and the step 214 is produced by the peripheral regions of the nonconductive layer 207 extending over the adjacent nonconductive layer 206.

The steps 212, 213, 214 may be provided by removing a peripheral portion of the nonconductive layers 204, 205, 206 on two opposing sides of the redistribution board 202. A peripheral portion having a width w of the nonconductive layer 206 may be removed and a portion of an underlying conductive layer exposed to provide an outer contact pad. A peripheral portion having a width 2w of the nonconductive layer 205 may be removed and a portion of an underlying conductive layer exposed to provide an outer contact pad. A peripheral portion having a width 3w of the nonconductive layer 204 may be removed and a portion of an underlying conductive layer exposed to provide an outer contact pad.

The electronic component 200 includes a plurality of outer contact pads 215 which are arranged on the protruding peripheral regions of the nonconductive layers 205, 206, 207 forming the steps 212, 213, 214. These outer contact pads 215 are provided by exposed portions of the redistribution structure 203 of the electronic component 200 and enable the semiconductor chip 201 to be electrically coupled to a further component or components external to the electronic component 200.

In the illustrated embodiment, the two opposing side faces 210, 211 have a similar contour so that the electronic component 200 has a mirror symmetrical contour. In other embodiments, three or four sides of the electronic component may also have the same structure. In embodiments in which all four sides of the redistribution board have the same stepped structure, the electronic component 200 can be described as having a pyramid-type form.

The electronic component 200 may be mounted in a cavity 221 of a circuit board 220 which has a size and inner contour corresponding to the outer contour of the electronic component 200. The cavity 221 includes side faces 222, 223 which oppose one another and which each have three steps 224, 225, 226 corresponding to the three steps 212, 213, 214 of the two opposing side faces 210, 211 of the electronic component 200.

The circuit board 220 also includes a redistribution structure 227 including conductive layers 228 positioned on or between nonconductive layers 229 and conductive vias 230 extending between conductive traces 231 of the conductive layers 228 arranged on either side of one of the nonconductive layers 229. Peripheral portions of the nonconductive layers 229 provide the steps 224, 225, 226.

The circuit board 220 further includes exposed contact pads 232 positioned on the steps 224, 225, 226 which are formed by exposed regions of the conductive layers 228, in particular distal ends of conductive traces 231 of the conductive layers 228 of the redistribution structure 227. The contact pads 232 are arranged on the upper horizontal surface of the steps 224, 225, 226 at positions corresponding to those of the outer contact pads 215 of the electronic component 200 in order that the outer contact pads 215 of the electronic component 200 may be electrically coupled to the redistribution structure 227 of the circuit board 220.

The outer contact pads 232 may be arranged on one or more of the steps 212, 213, 214 on one, two or more sides of the cavity 221. The contact pads 232 of the circuit board 220 have an arrangement corresponding to that of the electronic component 200 when the electronic component 200 is inserted in the cavity 221.

The steps 224, 225, 226 of the cavity 221 are provided by peripheral portions of the stacked nonconductive layers 229 of the circuit board 220 which protrude into the cavity 221. A lowermost nonconductive layer 233 extends furthest into the cavity 221 and provides a recess 234 for accommodating a portion of the electronic component, in particular the nonconductive layer 204 of the electronic component 200 which has the smallest lateral extent. The adjacent nonconductive layer 235 of the stack extends into the cavity by 221 a distance that is less than the lowermost conductive layer 233, but greater than the adjacent nonconductive layer 235 positioned above the nonconductive layer 233. Similarly, the uppermost nonconductive layer 236 of the stack is arranged on the nonconductive layer 235 such that the peripheral portion of the nonconductive layer 235 is uncovered. One or more contact pads 232 may be arranged on these exposed peripheral portions.

The cavity 221 may be formed in the circuit board 220 by removing portions of a prefabricated multilayer circuit board. The cavity 221 may also be formed during manufacture of the circuit board 220 by structuring each layer as it is added to the stack. The nonconductive layers may be providing with a cutout and stacked up to provide a cavity 221 having the desired inner contour.

The nonconductive layer 205 of the electronic component 200 is arranged in a recess 237 formed by the nonconductive layer 235 of the circuit board 220. The nonconductive layer 206 of the electronic component 200 is arranged in a recess 238 formed by the nonconductive layer 236 of the circuit board 220 and the nonconductive layer 207 of the electronic component 200 is arranged in a recess 239 formed by the nonconductive layer 236 of the circuit board 220.

Figure 5:
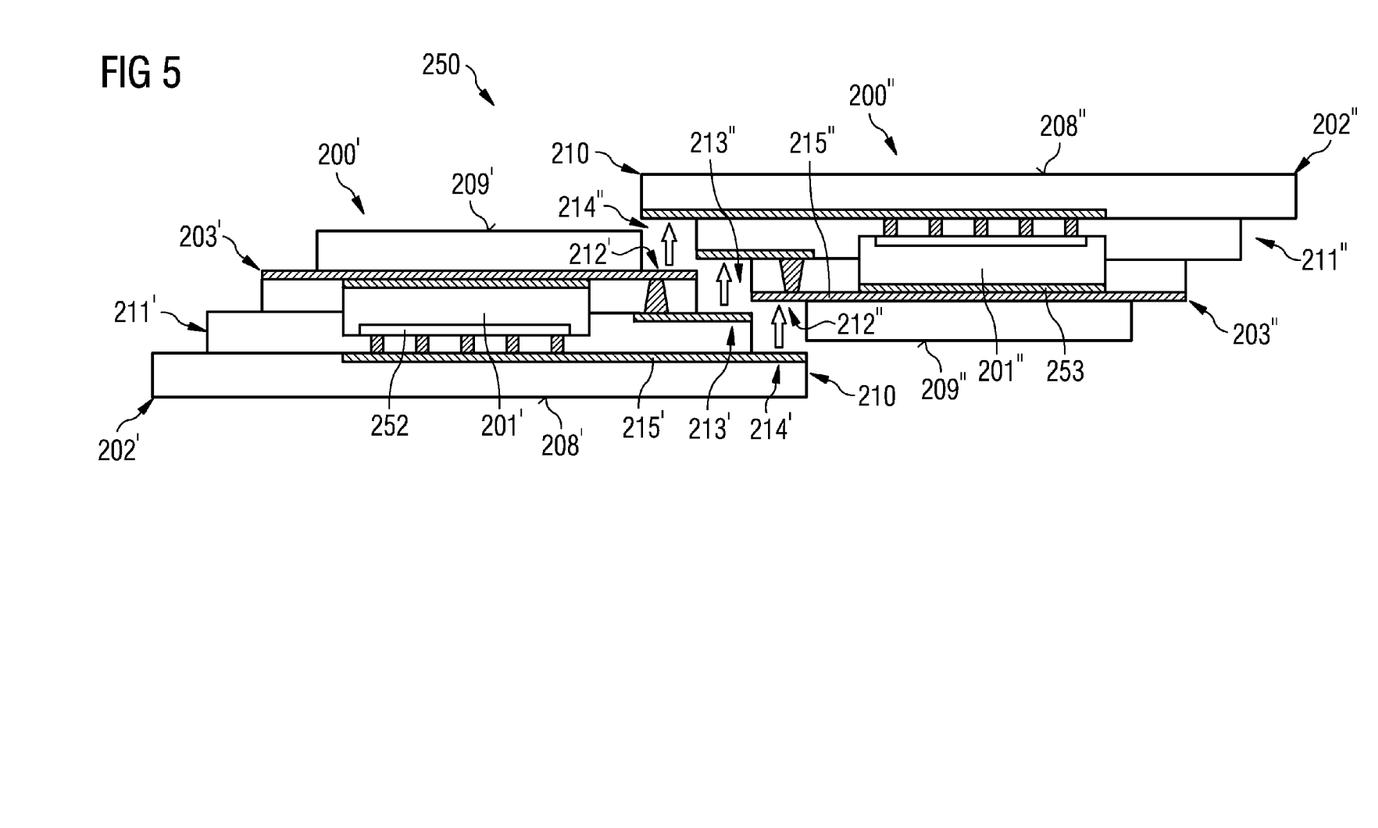
FIG. 5 illustrates an arrangement including two electronic components.

FIG. 5 illustrates an arrangement 250 including two electronic components 200', 200". The electronic components 200', 200" correspond to the electronic component 200 and have an arrangement in which one is inverted in comparison to the other.

The electronic component 200' is arranged with the largest major surface 208 facing in one direction, for example downwards, and the other electronic component 200" is arranged oppositely with the largest major surface 209 facing in the opposing direction, for example upwards. This enables the steps 212", 213", 214" on the second electronic component 200" to be mounted on, and supported by, the steps 212', 214', 213', respectively, of the other electronic component 200'. The two electronic components 200', 200" are electrically coupled to one another by the outer contact pads 215 of each of the electronic components 200', 200".

The arrangement 250 may be used to form circuits from two or more electronic components. For example, if each of the electronic components 200', 200" includes a transistor device, by mounting the two electronic components 200', 200" together, a half bridge circuit may be produced. The conductive redistribution structure 203', 203" of the electronic components 200', 200" may differ in order to provide the desired circuit when the electronic components 200', 200" are mounted together. In the arrangement 250 illustrated in FIG. 5, the electronic component 200' has a contact pad 215' exposed on step 212 which is mounted on the contact pad 215" of the electronic component 200" and which connects a source electrode 252 of the transistor 201' to a drain electrode 253 of the transistor 201" and, thus, forms a node of a half bridge circuit.

A cascode circuit may be formed by electrically coupling the gate electrode of a first transistor, for example a HEMT, to the source electrode of a second transistor, for example a MOSFET by an appropriate conductive structure within the redistribution board 202', 202" of the two electronic components 200', 200".

In the embodiment illustrated in FIG. 5, two electronic components are joined together. However, any number of electronic components may be joined together to form a desired circuit or to form a submodule. The electronic components may also include differing semiconductor devices, for example one electronic component may include a transistor, and a second electronic component may include a gate driver for the transistor.

The plurality of electronic components or the submodule including a plurality of pre-mounted electronic components may be mounted in a cavity of a circuit board which has a lateral size and contour suitable for accepting the combination of electronic components. The combination of components may be electrically connected to the redistribution structure of the circuit board by contact pads positioned on steps of the outermost surfaces of the electronic components and steps formed in the side faces of the cavity. However, the contacts may also be formed by other means such as bond wires, metallic ribbons and clips etc.

One or more of the steps of the electronic component may not include a contact pad. These steps of the electronic component may be mounted on steps of the cavity by a nonconductive adhesive or by a conductive adhesive as is used to mount the contact pads to contact pads the circuit board. Alternatively, any steps without contact pads may remain free of an adhesive or other connection with the corresponding step of the circuit board. In this embodiment, the mechanical joint between the electronic component and the circuit board is formed solely by the connections between the outer contact pads of the electronic component and the contact pads of the circuit board.

In the previously illustrated embodiments, each electronic component included a single semiconductor device, such as a single transistor device. However, an electronic component including two or more semiconductor devices embedded in a redistribution board including one or more steps in one or more side faces may also be provided.

Figure 6:
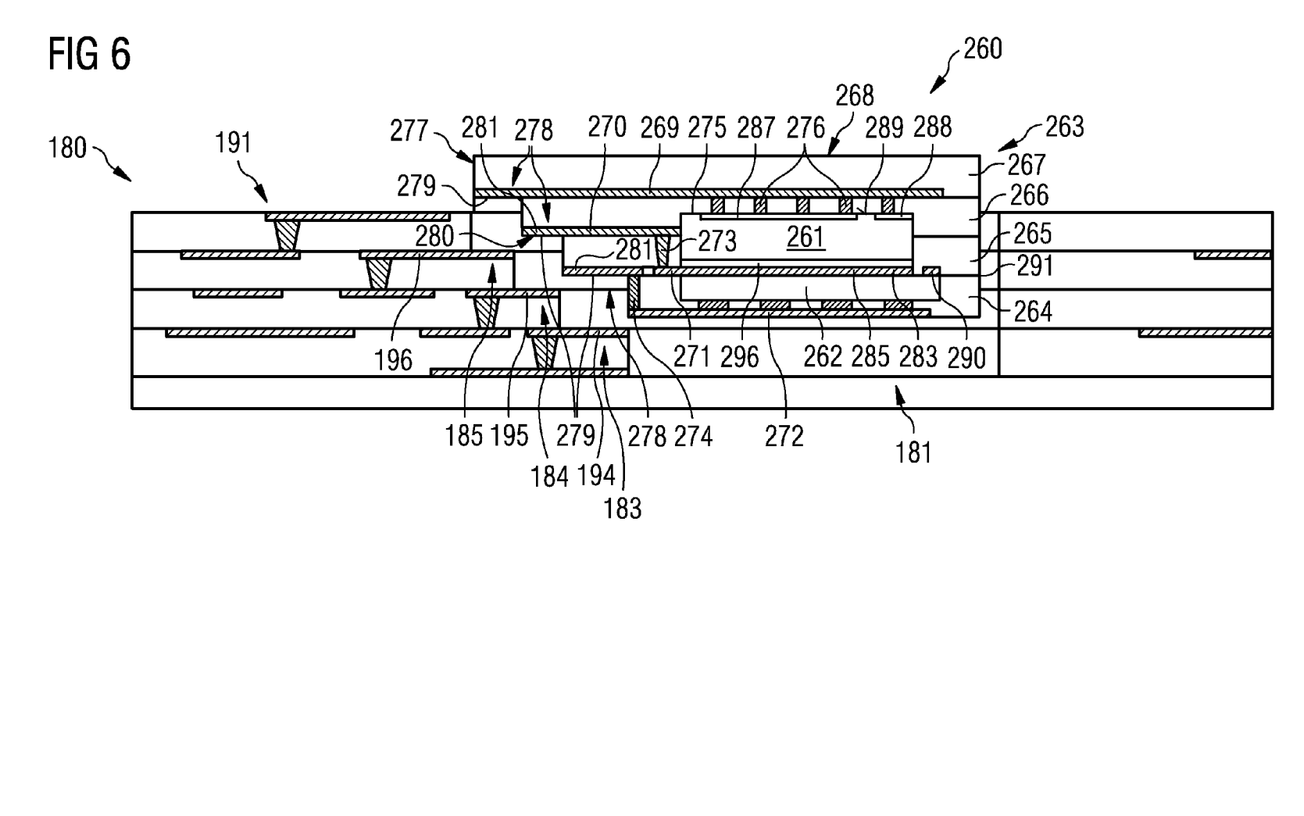
FIG. 6 illustrates an electronic component according to a fourth embodiment.

FIG. 6 illustrates an electronic component 260 including two semiconductor devices 261, 262 which, in this particular embodiment, are transistor devices. The two semiconductor devices 261, 262 are arranged in a stacked configuration within a redistribution board 263.

The redistribution board 263 includes four nonconductive layers 264, 265, 266, 267 and a conductive redistribution structure 268 including a conductive trace 269 positioned between the nonconductive layers 267, 266, a conductive trace 270 arranged between the nonconductive layers 266, 265, a conductive trace 271 arranged between nonconductive layers 265, 264 and a conductive trace 272 arranged on the lower surface of nonconductive layer 264. The redistribution structure also includes a conductive via 273 extending between the conductive traces 270 and 271 and a conductive via 274 extending between conductive traces 271 and 272.

The semiconductor device 261 includes a lower surface that is mounted on the conductive trace 271 and has a height such that the opposing upper surface 275 of the semiconductor device 261 is positioned within the thickness of the nonconductive layer 266. The redistribution structure 268 includes a further plurality of conductive vias 276 extending from the upper surface 275 of the first semiconductor device 261 to the conductive trace 269 positioned between nonconductive layers 266 and 267.

The second semiconductor device 262 is positioned in a first nonconductive layer 264 and is in contact with the conductive traces 271 and 272.

Similar to the electronic components of the second and third embodiments illustrated in FIGS. 3 to 5, at least one side face 277 of the redistribution board 263 includes a plurality of steps 278 produced by the removal of a portion of the adjoining nonconductive layer. The nonconductive layer 265 extends and protrudes over nonconductive layer 264. The nonconductive layer 266 extends over and protrudes from nonconductive layer 265 and nonconductive layer 267 extends over and protrudes from nonconductive layer 266. Each of the steps 278 includes at least one outer contact pad 279. Each of the outer contact pads 279 is formed by an exposed portion of a conductive trace of the conductive traces 269, 270, 271 positioned on a peripheral protruding portion of the nonconductive layers 265, 266, 267.

The embodiment illustrated in FIG. 6 provides a half bridge circuit. The second semiconductor device 262 providing the lower transistor of the stack is arranged in a drain down configuration with its drain electrode electrically coupled to the conductive trace 272 and the outer contact pad 281 positioned on nonconductive layer 265. The source electrode 283 is positioned on the upper surface of the semiconductor device 262 and is electrically coupled with the conductive trace 285 which is electrically coupled to the outer contact pad 280 positioned on nonconductive layer 266. The gate electrode 290 is arranged on the upper surface of the semiconductor device 262 and is electrically coupled to a conductive trace 291 of the redistribution structure 268.

The semiconductor device 261 is arranged in a drain down configuration. The drain electrode 286 is mounted on conductive trace 285 and is coupled with the source of the lower transistor 262 via conductive trace 285 and is therefore coupled to outer contact pad 280. The outer contact pad 280 provides access to the node of the half bridge structure.

The source electrode 287 and gate electrode 288 positioned on the upper surface 289 of the first semiconductor device 261 are electrically coupled to the conductive trace 269 and extend to contact pads 279 positioned on nonconductive layer 267.

The electronic component 260 may be mounted on the circuit board 180 including a cavity 181 and redistribution structure 191, in a similar manner to the embodiment illustrated in FIG. 3. For example, the electronic component 260 may be inserted into a cavity 181 one of the circuit board 180 such that the contact pads 279, 280, and 281 positioned on the steps 278 are engaged with contact pads 194, 195, 196 positioned on the steps 183, 184, 185 of the circuit board 180.

Figure 7:
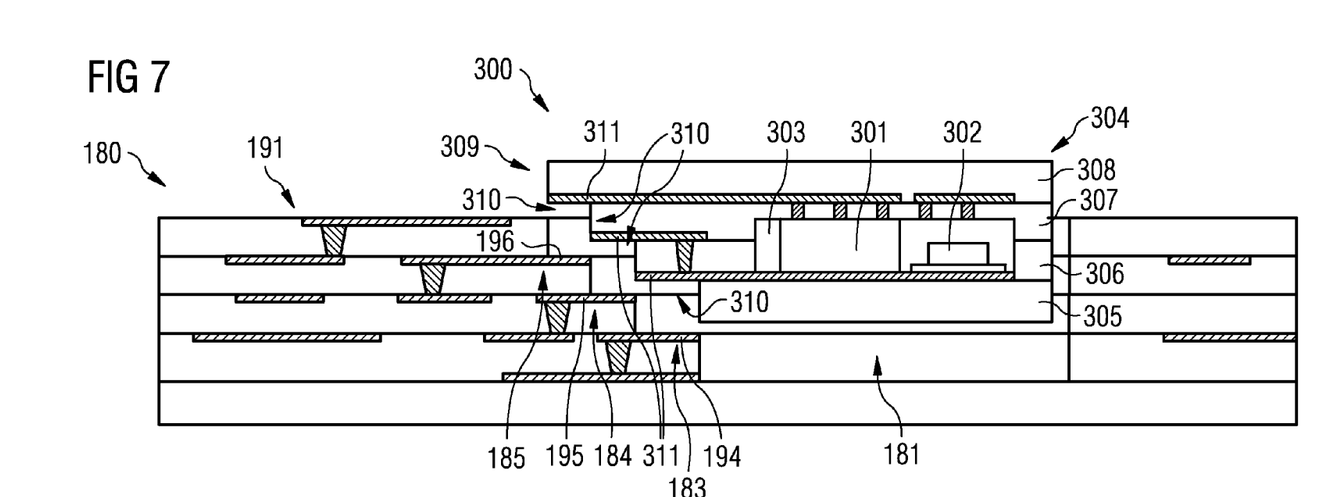
FIG. 7 illustrates an electronic component according to a fifth embodiment.

FIG. 7 illustrates an electronic component 300 according to a fifth embodiment. The electronic component 300 includes two semiconductor devices 301, 302 arranged in a common cavity 303 within the redistribution board 304. The redistribution board 304 includes a plurality of nonconductive layers and a plurality of conductive layers. In the embodiment illustrated in FIG. 7, the redistribution board 304 includes four nonconductive layers 305, 306, 307, 308 and three conductive layers 309, 310, 311 arranged between nonconductive layers 305, 306, between nonconductive layers 306, 307 and between nonconductive layers 307, 308, respectively. However, the redistribution board is not limited to this number of nonconductive layers and conductive layers and may have a greater or lesser number of nonconductive layers and conductive layers.

The cavity 303 is positioned in nonconductive layers 306, 307 and may have dimensions suitable for accommodating two or more semiconductor devices. The semiconductor devices may be positioned entirely within the cavity or may extend to an upper surface of the cavity. Semiconductor devices may be unpacked semiconductor chips, so called bare dies, or may be packaged devices, for example. The semiconductor devices may be electrically coupled to a rewiring structure 308 positioned on the base and/or walls forming the cavity 303.

The redistribution board 304 of the electronic component 300 includes at least one side face 309 including at least one step 310 and at least one outer contact pad 311 of the redistribution structure 312 of the redistribution board 304 exposed on the step 310. In the embodiment illustrated in FIG. 7, the side face 309 includes three steps 310 each including at least one outer contact pad 311 of the electronic component 300.

The electronic component 300 may be mounted on a circuit board 180 including a cavity 181 and redistribution structure 191. For example, the electronic component 300 may be inserted into a cavity 181, or recess, in a surface of the circuit board 180 such that the contact pads 311 positioned on the steps 310 are engaged with contact pads 194, 195, 196 positioned on the steps 183, 184, 185 of the circuit board 180.

Figure 8:
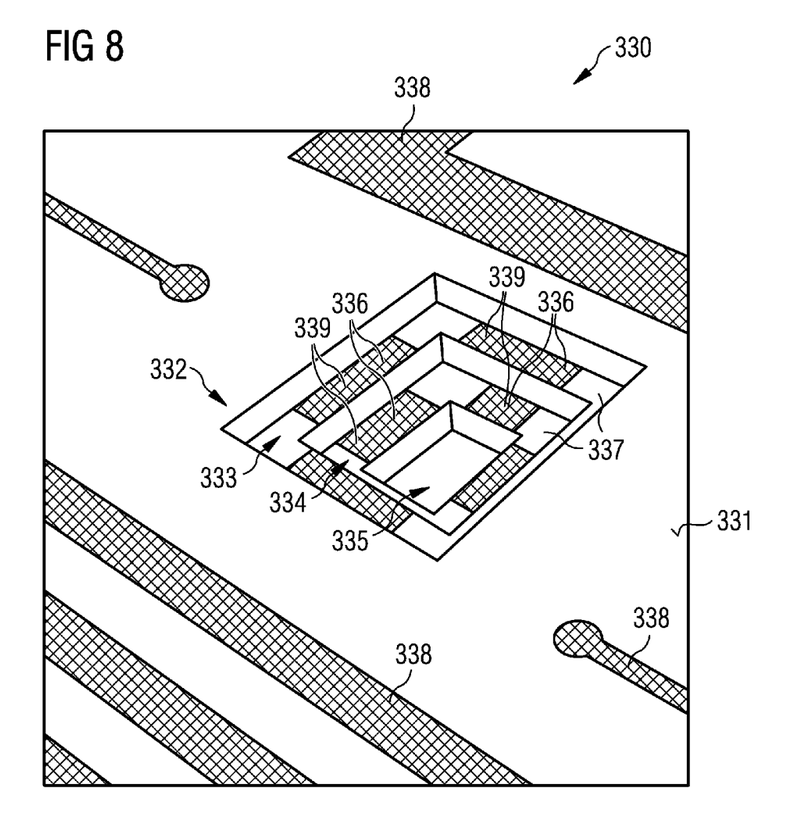
FIG. 8 illustrates a perspective view of a portion of a circuit board.

FIG. 8 illustrates a portion of a circuit board 330, in particular a top surface 331 which includes a cavity 332 for receiving an electronic component. The cavity 332 has a generally square pyramid shape with an upper larger recess 333, an intermediate recess 334 and a lower recess 355, the intermediate recess 334 having a lateral area intermediate between that of the upper recess 333 and the lower recess 335. The upper recess 333 and the intermediate recess 334 include a peripheral ledge or step 337 on which exposed portions of conductive traces 336 of a multilayer redistribution structure are positioned. The exposed portions of the conductive traces 336 provide contact pads 339. The redistribution structure includes further conductive traces 338 positioned on the top surface 331 and conductive vias not seen in FIG. 8 extending through the thickness of one or more nonconductive layers.

The cavity 332 is open on the surface 331 and may be used to receive an electronic component having a similar square pyramid form with steps in four side faces. However, the electronic component may have one or more steps on only one fewer than four sides and may be mounted on one or less than four of the sides of the pyramid and in less than three of the recesses 333, 334, 335 of the cavity 332.

The steps 337 within the cavity 332 are provided by portions of nonconductive layers of the circuit board 330. The steps 337 have a height corresponding to the thickness of the nonconductive layers.

Figure 9:
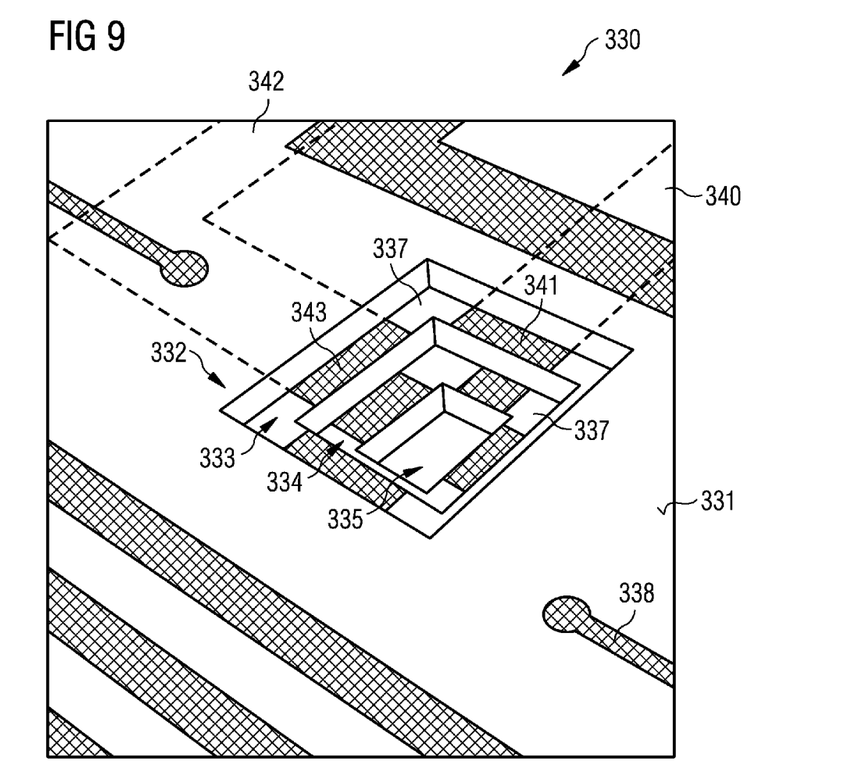
FIG. 9 illustrates a perspective view of a portion of a circuit board including conductive traces.

FIG. 9 illustrates a further view of the circuit board 330 in which the position of a conductive trace 340 extending from the first exposed portion 341 in the upper recess 333 of the cavity 332 and a second conductive trace 342 extending from the second exposed portion 343 arranged in the upper recess 333 is indicated. The first conductive trace 340 and the second conductive trace 342 are illustrated in FIG. 9 by dashed lines as they are positioned within the body of the circuit board 330, in particular, between the uppermost nonconductive layer and the next underlying nonconductive layer. The thickness of these nonconductive layers determines the thickness of the recesses 333, 334, 335 of the cavity 332.

The first conductive trace 340 is a low voltage conductive trace and the second conductive trace 342 is a high-voltage conductive trace. The low voltage conductive trace 340 and the high voltage conductive trace 342 are arranged in the circuit board 330 so that they do not overlap. The low voltage conductive trace 340 is configured to be coupled to low voltage electrodes of an electronic component mounted in the cavity 332. Low voltage electrodes include signal electrodes, ground electrodes and a source electrode of an n-type MOSFET transistor, for example. The high voltage trace 342 is configured to be coupled to high voltage electrodes of an electronic component mounted in the cavity 332. A high voltage electrode may be a drain electrode of an n-type MOSFET transistor, for example. The non-overlapping arrangement of the low voltage conductive trace and the high voltage conductive trace can assist in reducing creepage.

As used herein, the creepage distance is defined as the shortest path between two conductive materials measured along the surface of an isolator which is positioned in between. Maintaining a minimum creepage distance may assist in reducing the risk of failure over time. The generation of a conductive path along the isolator surface due to the high voltage applied over long periods of time, i.e. creepage, is related to the RMS value and also may depend on environmental conditions which may be described by a degree of pollution and the materials characteristics of the isolator.

The low voltage conductive trace 340 may be directly coupled to a source electrode of a transistor and the high-voltage trace 342 may be connected to a high-voltage electrode of a transistor such as a drain electrode.

In the embodiment illustrated in FIG. 9, the low voltage conductive trace 340 and the high voltage conductive trace 342 are arranged in the same layer of the multilayer circuit board.

Figure 10:
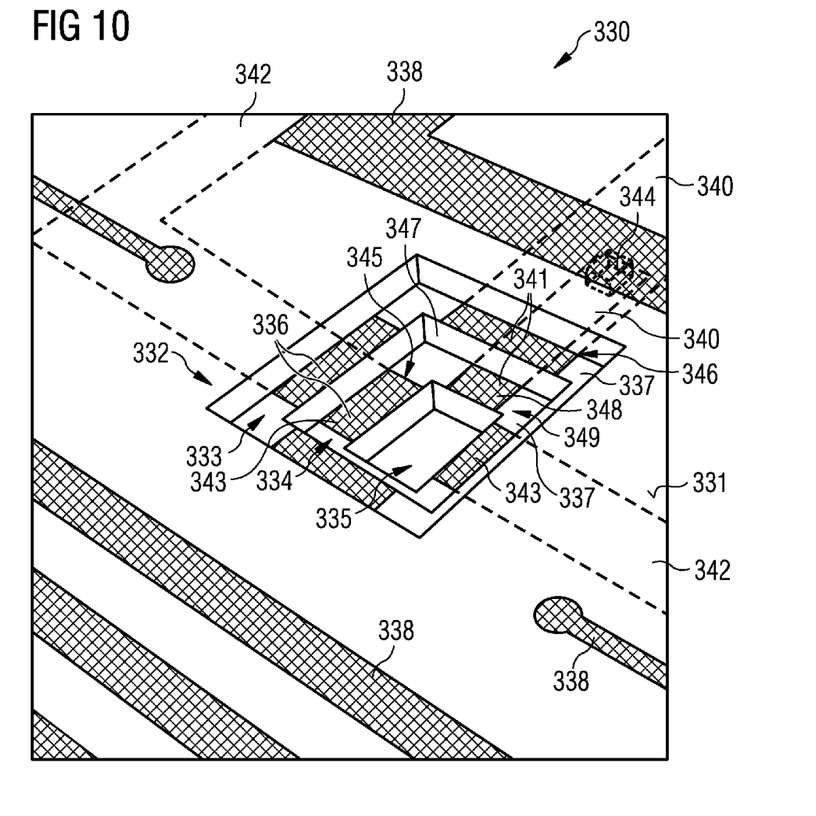
FIG. 10 illustrates a perspective view of a portion of a circuit board including conductive traces.

FIG. 10 illustrates an embodiment of the circuit board 330 in which the low voltage traces 340 and the high-voltage traces 342 are arranged in differing layers within the multilayer circuit board 330. For example, all of the high-voltage traces 342 may be arranged in a first layer 345 and all of the low voltage traces 340 in a second layer 346 spaced apart from the first layer 345 by one or more nonconductive layers 347 of the circuit board 330. This arrangement can also assist in reducing creepage as the creepage distance may be increased over an arrangement in which the high voltage traces 342 and the low voltage traces 340 are arranged in a common layer.

Conductive vias 344 may be provided in order to route a trace 348 from an adjacent layer 349 to the plane in which the corresponding traces of the redistribution structure are positioned. For example, a low voltage trace 348 in a lower layer may be coupled to the low voltage traces 340 in the second layer 346 by a conductive via 344 arranged adjacent the cavity 332.

In embodiments in which the high-voltage traces 342 are arranged in a different layer to the low voltage traces 340, the low voltage traces 340 and high-voltage traces 342 may also be arranged such that they do not overlap.

Methods will now be described with reference to flowcharts. The flowcharts 350 and 360 in FIGS. 11 and 12, respectively, each describe the steps according to one embodiment, of a method for fabricating an electronic component with a semiconductor device embedded in a redistribution board including at least one step in at least one side face. It is noted that certain details and features have been left out of flowcharts 350, 360 that are apparent to a person of ordinary skill in the art. For example, a step may include one or more substeps or may involve specialized equipment or materials, as known in the art. While steps 351 to 353 and 361 to 369 indicated in the flowcharts 350 and 360 are sufficient to describe one embodiment of the, other embodiments may utilize steps different from those shown in flowcharts 350, 360.

Figure 11:
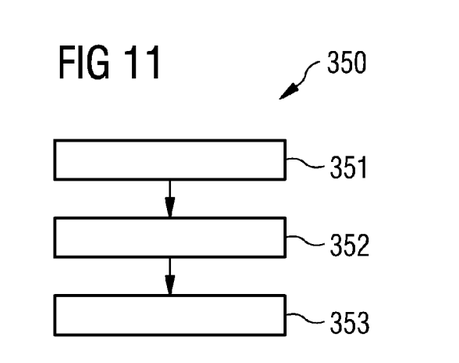
FIG. 11 illustrates a flow diagram of a method according to a sixth embodiment.

Beginning with step 351 of the flowchart 350, step 351 includes providing an electronic component that includes a redistribution board including at least a first nonconductive layer, a second nonconductive layer and rewiring structure including a conductive layer positioned between the first and second nonconductive layers. The semiconductor device is embedded within the redistribution board and is electrically coupled with the conductive layer.

Continuing with step 352, a peripheral portion of one of the nonconductive layers is removed, for example by laser ablation.

Continuing with step 353 a portion of the conductive layer previously buried underneath the removed peripheral portion of one of the nonconductive layers is exposed. The exposed portion of the conductive layer is positioned on a protruding nonconductive layer having a form of a step. The peripheral region of the first nonconductive layer may be removed over the entire length of one or more of the side faces of the electronic component.

Figure 12:
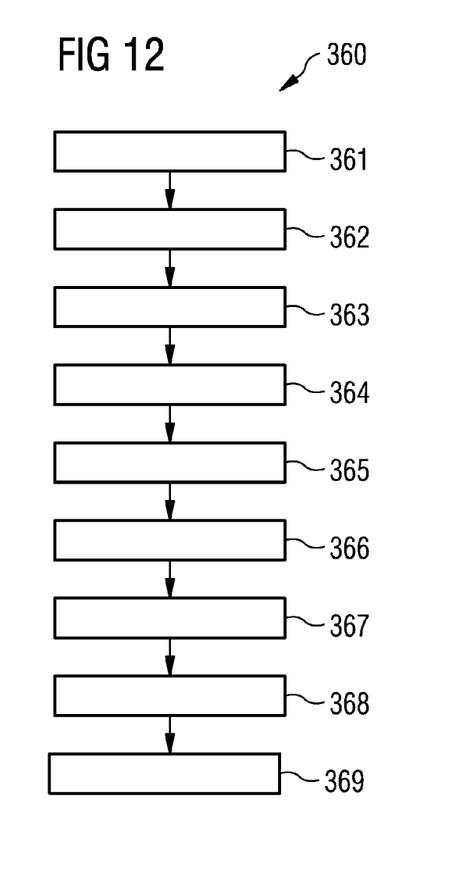
FIG. 12 illustrates a flow diagram of a method according to a seventh embodiment.

FIG. 12 illustrates a flow chart 360 of a method for fabricating an electronic component. Beginning with step 361, a core layer including a nonconductive material such as glass-fibre reinforced epoxy resin is provided in the form of the sheet. Continuing with step 362, an adhesive, for example layer of pre-preg, is applied to the core layer. Continuing with step 363, a conductive layer, for example a metallic foil such as copper foil, is applied to the adhesive layer and, optionally, structured to produce one or more conductive traces. Continuing with step 364, a layer of adhesive is applied to the conductive layer. Continuing with step 365, a core layer including a cutout is applied to the adhesive layer, and in step 366 a semiconductor device is placed into the cutout. Continuing with step 367, a further adhesive layer and in step 368 a conductive layer are applied. Optionally, further layers may be applied to build a multilayer assembly. Continuing with step 369, the multilayer assembly is then heat treated, optionally under pressure, in order to join various layers of the redistribution board to one another and to electrically couple the semiconductor device to the conductive layers providing the redistribution structure of the redistribution board and to embed the semiconductor device within the redistribution board.

In order to form a step in a side face of the electronic component, a peripheral portion of one of the outer nonconductive layers can be removed to expose the underlying conductive trace which provides an outer contact pad for the electronic component. For example, the method described by flow chart 350 of FIG. 11 may be used.

Typically, a large number of electronic devices will be fabricated in a single panel and the panel is cut or singulated to form individual electronic components. The peripheral portions may be removed to produce exposed areas of the conductive layers and outer contact areas either before or after the singulation process.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic component, comprising:
   at least one semiconductor device; and
      a redistribution board comprising at least two nonconductive layers and a conductive redistribution structure,
   wherein the semiconductor device is embedded in the redistribution board and electrically coupled to the conductive redistribution structure and the redistribution board has a side face facing away from the semiconductor device in a direction parallel to the at least two nonconductive layers and spaced apart from the semiconductor device in said direction, with the side face having a step, and wherein an outer contact pad of the conductive redistribution structure is arranged on the step.

2. The electronic component according to claim 1, wherein the step extends the length of the side face.

3. The electronic component according to claim 1, further comprising:
   a first non-conductive layer and a second non-conductive layer, the first non-conductive layer protruding from a side face of the second non-conductive layer and providing the step.

4. The electronic component according to claim 1, wherein the step comprises a tread and a rise and the outer contact pad is arranged on the tread.

5. The electronic component according to claim 1, further comprising an additional step in a second side face of the redistribution board.

6. The electronic component according to claim 1, wherein the conductive redistribution structure comprises a fan out distribution from at least one inner contact pad to the outer contact pad.

7. The electronic component according to claim 1, wherein the conductive redistribution structure includes a least one via extending through the thickness of at least one nonconductive layer.

8. The electronic component according to claim 1, wherein the semiconductor device is a transistor device.

9. The electronic component according to claim 1, further comprising an additional redistribution structure for current sensing.

10. The electronic component according to claim 9, wherein the additional redistribution structure comprises at least one electrically conductive via comprising a material having a resistivity greater than the resistivity of a conductive trace of the conductive redistribution structure.

11. The electronic component according to claim 1, further comprising:
    a first semiconductor device comprising a first transistor; and
    a second semiconductor device comprising a second transistor, the second transistor being configured in at least one of a half-bridge configuration and a cascode configuration with the first transistor.

12. The electronic component according to claim 1, wherein the semiconductor device is a packaged semiconductor device and the packaged semiconductor device is mounted in a cavity in the redistribution board.

13. The electronic component according to claim 1, wherein the semiconductor device is arranged in a plurality of non-conductive layers.

14. The electronic component according to claim 1, further comprising at least two semiconductor chips in a stacked configuration.

15. The electronic component according to claim 1, wherein a major surface of the semiconductor device is arranged in a first plane and is electrically coupled to a conductive trace arranged in an interface between two nonconductive layers, the interface being a second plane different from the first plane.

16. An arrangement, comprising:
    a circuit board comprising a plurality of non-conductive layers, a redistribution structure,
       and at least one cavity including a step comprising a contact pad electrically coupled to the redistribution structure; and
    an electronic component comprising a redistribution board and at least one semiconductor device embedded in the redistribution board, the redistribution board having a side face with a step and an outer contact pad arranged on the step,
   wherein the electronic component is mounted in the cavity and the outer contact pad of the electronic component is mounted on the contact pad of the circuit board.

17. The arrangement according to claim 16, wherein the outer contact pad of the electronic component is electrically coupled to the contact pad of the circuit board by one of solder and an electrically conductive adhesive.

18. The arrangement according to claim 16, wherein the circuit board includes a high voltage conductive trace and a low voltage conductive trace extending in non-overlapping directions from the electronic component.

* * * * *